(12) United States Patent
Wang et al.

(10) Patent No.: US 10,297,446 B2
(45) Date of Patent: May 21, 2019

(54) ENCAPSULATED SUBSTRATE, MANUFACTURING METHOD, HIGH BAND-GAP DEVICE HAVING ENCAPSULATED SUBSTRATE

(71) Applicant: Hsiao-Lei Wang, Taoyuan (TW)

(72) Inventors: Hsiao-Lei Wang, Taoyuan (TW); Po-Yen Liu, Taoyuan (TW); Kao-Mei Sung, Taoyuan (TW)

(73) Assignee: Hsiao-Lei Wang, Taoyuan (TW)

( * ) Notice: Subject to any disclaimer, the term of this patent is extended or adjusted under 35 U.S.C. 154(b) by 0 days.

(21) Appl. No.: 16/018,029

(22) Filed: Jun. 25, 2018

(65) Prior Publication Data
US 2019/0006177 A1   Jan. 3, 2019

(30) Foreign Application Priority Data

Jun. 30, 2017 (TW) ............................ 106122132 A

(51) Int. Cl.
| | |
|---|---|
| H01L 21/00 | (2006.01) |
| H01L 21/02 | (2006.01) |
| H01L 33/00 | (2010.01) |
| C30B 23/02 | (2006.01) |
| H01L 33/32 | (2010.01) |
| C30B 29/16 | (2006.01) |
| C30B 29/40 | (2006.01) |
| C30B 29/68 | (2006.01) |
| H01L 33/12 | (2010.01) |
| H01L 29/786 | (2006.01) |

(52) U.S. Cl.
CPC ...... *H01L 21/02502* (2013.01); *C30B 23/025* (2013.01); *C30B 29/16* (2013.01); *C30B 29/403* (2013.01); *C30B 29/406* (2013.01); *C30B 29/68* (2013.01); *H01L 21/0254* (2013.01); *H01L 21/02403* (2013.01); *H01L 21/02433* (2013.01); *H01L 21/02554* (2013.01); *H01L 33/007* (2013.01); *H01L 33/12* (2013.01); *H01L 33/32* (2013.01); *H01L 29/7869* (2013.01)

(58) Field of Classification Search
CPC .......... H01L 21/02554; H01L 29/7869; H01L 21/02403
See application file for complete search history.

(56) References Cited

U.S. PATENT DOCUMENTS

| | | | | |
|---|---|---|---|---|
| 6,624,441 B2* | 9/2003 | Cantwell | ................. | C30B 23/02 257/43 |
| 6,673,478 B2* | 1/2004 | Kato | ....................... | C30B 23/02 117/106 |
| 7,964,868 B2* | 6/2011 | Nakagawa | ............ | C23C 14/042 257/102 |
| 8,502,219 B2* | 8/2013 | Horio | ................ | H01L 21/02403 257/43 |

(Continued)

*Primary Examiner* — Nicholas J Tobergte
(74) *Attorney, Agent, or Firm* — Leong C. Lei

(57) ABSTRACT

An encapsulated substrate includes a zinc oxide substrate and a composite barrier layer. The composite barrier layer includes a first film layer having a first material different from zinc oxide, a second film layer covered on a surface of the first film layer and having a second material different from the zinc oxide and the first material, and an active layer formed on the composite barrier layer and corresponding to an acting surface of a zinc oxide substrate and having an acting material different from the zinc oxide.

16 Claims, 9 Drawing Sheets

(56) References Cited

U.S. PATENT DOCUMENTS

| | | | | |
|---|---|---|---|---|
| 8,530,272 B2* | 9/2013 | Horio | ............... | C30B 25/02 257/43 |
| 2006/0170013 A1* | 8/2006 | Kato | ............... | H01L 29/045 257/252 |
| 2009/0044745 A1* | 2/2009 | Sekiwa | ............... | C30B 9/12 117/36 |
| 2009/0087940 A1* | 4/2009 | Kushiya | ............ | C23C 16/306 438/94 |
| 2009/0256148 A1* | 10/2009 | Park | ............... | H01L 33/28 257/43 |
| 2009/0267062 A1* | 10/2009 | Nakahara | ......... | H01L 29/225 257/43 |
| 2009/0267063 A1* | 10/2009 | Nakagawa | ......... | C23C 14/042 257/43 |
| 2009/0283782 A1* | 11/2009 | Shakuda | ......... | H01L 21/02403 257/94 |
| 2010/0230671 A1* | 9/2010 | Nakahara | ............ | C30B 23/02 257/43 |
| 2010/0233836 A1* | 9/2010 | Kyotani | ......... | H01L 21/02403 438/46 |
| 2010/0295039 A1* | 11/2010 | Horio | ............... | C30B 25/02 257/43 |
| 2010/0295040 A1* | 11/2010 | Horio | ............ | H01L 21/02403 257/43 |
| 2011/0089418 A1* | 4/2011 | Yamamuro | ...... | H01L 21/0237 257/43 |

* cited by examiner

ENCAPSULATED SUBSTRATE, MANUFACTURING METHOD, HIGH BAND-GAP DEVICE HAVING ENCAPSULATED SUBSTRATE

BACKGROUND OF THE INVENTION

1. Field of the Invention

The invention relates to a substrate, and in particular relates to an encapsulated zinc oxide substrate, a manufacturing method thereof, and a high band-gap device having the substrate.

2. Description of the Related Art

In the manufacturing processes of light-emitting diode devices, an epitaxyis an important factor to decide the quality of products, especially to the illuminative efficiency and durability, etc. In particular, the reason is that photons can be smoothly produced by operating electrons with electric holes in coordination when the constituted crystalline of the light-emitting diode is excited. If defects are occurred in the material structure or configuration, the mutual bonding process of the electrons and the electric holes is possibly hindered, thus to degrade the illuminative effect of the light-emitting diode.

Nowadays, gallium nitride (GaN) is selected as a major light-emitting material for the light-emitting diodes. It is generally to use the epitaxy to grow on a substrate, and the production of gallium nitride crystalline structure and configuration is majorly influenced by the applied substrate. To increase the illuminative efficiency, durability and other related quality features of the light-emitting diodes, several conditions should be considered while selecting a substrate material.

In general, a monocrystalline material having a reduced defect density is preferably utilized to be the substrate material, so that the crystalline quality of the light-emitting diode does not affect by the epitaxy. In the current techniques, sapphire is commonly utilized to be the substrate material based on its advantages such as excellent chemical stability and manufacturing technique completeness. However, with the increasing production capacity of sapphire in recent years, the sapphire substrate is gradually replaced by other economic substitutes such as aluminum nitride substrates and even gallium nitride substrate.

Melting points of the aluminum nitride and the gallium nitride are over 2,000 centigrade. In other words, if the fusion crystal growth method is utilized to produce the monocrystalline substrate of these two materials, the manufacturing cost is relatively high and the waste heat will be relatively produced in the manufacturing process, thus to pollute the environment. However, due to the sapphire substrate having high hardness and excellent chemical stability, the subsequent manufacturing process after the epitaxy will be suffered several difficulties. For example, light-emitting diode dies might be easily damaged by errors occurred in the grinding process of the sapphire substrate.

On the other hand, a person skilled in this field is disclosed with a zinc oxide substrate which has a lower cost than the afore-mentioned materials. However, the zinc oxide substrate is not wildly used in the current technical fields due to its high chemical active, ease of diffusion in the epitaxy, doping into the light-emitting diode dies, and unexpected illuminative properties. Besides, peeling-off or cracking of the zinc oxide substrate might be happened due to thermal stress produced by phase transition or different coefficient of material thermal expansion.

In 2009, in the disclosure of NolaLi from his doctoral dissertation in Georgia Institute of Technology, peeling-off and cracking of the zinc oxide substrate might be happened due to thermal stress produced by phase transition when the epitaxy is directly applied on the zinc oxide substrate. For this reason, NolaLi put a multilayered structure as a stress buffering disposed between the light-emitting diode gallium nitride crystal and the zinc oxide substrate in his experiments, thus to prevent the peeling-off and cracking of the zinc oxide substrate and to increase flexibility in subsequent manufacturing processes such as annealing. However, in his researches, the problem of zinc atoms upwardly diffusion to the deposited growth crystal cannot be solved. Thus, the zinc oxide substrate cannot be wildly used in the market due to these above defects.

An ideal growth of light-emitting diode dies is also determined by the epitaxy. Nowadays, physical and chemical depositions are commonly seen. A film formed in the physical deposition is apt to have a die growth in a perpendicular direction (z). A film formed in the chemical deposition is apt to have a continuing develop on the film surface, thus to form an uneven surface. In the physical and chemical depositions, risks of increasing freedom degree of zinc oxide atoms diffusion and upwardly diffusion to the epitaxylight-emitting diode dies are existed. For example, in the physical deposition, boundaries formed between column crystals are functioned as diffusion channels for the zinc oxide substrate.

To sum up, in current techniques, excellent substrate surfaces and film surfaces with best quality should be demanded, and the problem of substrate atoms diffusion should be overcome. Besides, the light-emitting diode dies should be suitable for subsequent manufacturing process after the epitaxy is applied, and even electronic components should be minimized for the current trend.

BRIEF SUMMARY OF THE INVENTION

In view of this, the purpose of the invention provides an encapsulated zinc oxide substrate, a manufacturing method thereof, and a high band-gap device having the substrate. With a composite barrier layer to provide multilayered material interface, freedom degree of atomic diffusion of a zinc oxide substrate can be lessened and thus a barrier effect can be attained.

Another purpose of the invention is to provide an encapsulated zinc oxide substrate, a manufacturing method thereof, and a high band-gap device having the substrate. With a chemically relatively stabilized material to form a film disallowing zinc oxide molecule to easily diffuse, freedom degree of atomic diffusion of a zinc oxide substrate can be lessened and thus a barrier effect can be attained.

Another purpose of the invention is to provide an encapsulated zinc oxide substrate, a manufacturing method thereof, and a high band-gap device having the substrate. With a chemically relatively stabilized material to reduce accumulative stresses possibly formed between composite barrier layers in the epitaxy and subsequent manufacturing processes, the structure can be stabilized and suitable for subsequent heat treatment or other manufacturing processes.

Further purpose of the invention is to provide an encapsulated zinc oxide substrate, a manufacturing method thereof, and a high band-gap device having the substrate. With the multilayered film structure of the composite barrier layer to buffer accumulative stresses formed in a zinc oxide substrate and between composite barrier layers in the epitaxy and subsequent manufacturing processes, the structure can be suitable for subsequent heat treatment or other manufacturing processes.

Further purpose of the invention is to provide an encapsulated zinc oxide substrate, a manufacturing method thereof, and a high band-gap device having the substrate. With a preferred chemical active of a zinc oxide substrate, the structure can be suitable for subsequent heat treatment or other manufacturing processes.

Another purpose of the invention is to provide an encapsulated zinc oxide substrate, a manufacturing method thereof, and a high band-gap device having the substrate. With an economic zinc oxide substrate cooperated with a composite barrier layer manufacturing method, an economic substrate can be provided.

Another purpose of the invention is to provide an encapsulated zinc oxide substrate, a manufacturing method thereof, and a high band-gap device having the substrate. With the multilayered film of the composite barrier layer, the thickness of the composite barrier layer and diffusion phenomenon can be precisely controlled.

To attain the above purposes, the invention discloses an encapsulated substrate which comprises a zinc oxide substrate comprising at least one acting surface and being a zinc oxide material having a standard lattice structure of a wurtzite lattice structure;

a composite barrier layer having a thickness greater than 1 nanometer and being surroundingly covered on the zinc oxide substrate, comprising a first film layer which has a thickness greater than 0.1 nanometer and is directly covered and formed on the zinc oxide substrate comprises a first material different from zinc oxide and is provided with a lattice constant ranged between 120% and 115% or between 105% and 95% of the standard lattice structure as being in the form of the wurtzite lattice structure;

a second film layer which has a thickness greater than 0.1 nanometer and is directly covered and formed on a surface of the first film layer comprises a second material different from the zinc oxide and the first material and is provided with a lattice constant ranged between 120% and 115% or between 105% and 95% of the standard lattice structure as being in the form of the wurtzite lattice structure;

a plurality of accumulating film layers sequentially formed on the second film layer and each of which being different from the adjacent accumulating film layer and/or the second film layer and provided with a lattice constant ranged between 120% and 115% or between 105% and 95% of the standard lattice structure as being in the form of the wurtzite lattice structure; and an active layer formed on the composite barrier layer and corresponding to at least one acting surface, comprising an acting material different from the zinc oxide and provided with a lattice constant ranged between 105% and 95% of the standard lattice structure as being in the form of the wurtzite lattice structure.

The zinc oxide substrate is a monocrystalline, and the acting surface of the zinc oxide substrate is a (0001) surface of a wurtzite crystalline structure.

At least the first material of the first film layer, the second material of the second film layer, and at least part of material of the accumulating film layers is selected of groups composed of oxide, nitride and/or carbide of aluminum, boron, titanium, hafnium, niobium, thallium and rhenium, and the acting material of the active layer comprises aluminum-nitride based and/or gallium nitride based materials.

The first film layer, the second film layer and the accumulating film layers are formed of amorphous structure.

An accumulating thickness of the composite barrier layer is ranged between 1 and 5,000 nanometers.

The accumulating thickness of the composite barrier layer is ranged between 10 and 1,000 nanometers.

A method of manufacturing an encapsulated substrate is disclosed. The encapsulated substrate comprises a monocrystalline having a standard lattice structure of a wurtzite lattice structure and a zinc oxide substrate having an acting surface and at least one composite barrier layer being surroundingly covered on the zinc oxide substrate, in which the composite barrier layer comprises a first film layer having a thickness greater than 0.1 nanometer and being directly covered and formed on the zinc oxide substrate, a second film layer having a thickness greater than 0.1 nanometer and being directly covered and formed on a surface of the first film layer, a plurality of accumulating film layers sequentially formed on the second film layer, and an active layer corresponding to at least one acting surface to be formed on the composite barrier layer, comprising the steps of:

a) providing a piece of the zinc oxide substrate;

b) at least depositing a layer of film in accordance with the following secondary steps sequentially:

b1) directly depositing one first film layer comprising a first material on the zinc oxide substrate to cover thereon, in which the first material is different from zinc oxide and is provided with a lattice constant ranged between 120% and 115% or between 105% and 95% of the standard lattice structure as being in the form of the wurtzite lattice structure;

b2) directly depositing one second film layer comprising a second material on the first film layer to cover thereon, in which the first material is different from the zinc oxide and the first material and is provided with a lattice constant ranged between 120% and 115% or between 105% and 95% of the standard lattice structure as being in the form of the wurtzite lattice structure; and b3) depositing at least one accumulating film layer on the second film layer and the material of each accumulating film layer being different from that of the adjacent accumulating film layer and/or the second film layer and the zinc oxide and provided with a lattice constant ranged between 120% and 115% or between 105% and 95% of the standard lattice structure as being in the form of the wurtzite lattice structure; and c) depositing the active layer on the composite barrier layer corresponding to at least one acting surface, in which the active layer comprises one acting material different from the zinc oxide and is provided with a lattice constant ranged between 105% and 95% of the standard lattice structure as being in the form of the wurtzite lattice structure.

The first material of the first film layer in the step b1), the second material of the second film layer in the step b2), and at least part of material of the accumulating film layers in the step b3) is selected of groups composed of oxide, nitride and/or carbide of aluminum, boron, titanium, hafnium, niobium, thallium and rhenium, and the acting material of the active layer in the step c) comprises aluminum-nitride based and/or gallium nitride based materials.

The dispensed encapsulated substrate comprises a dispensed zinc oxide substrate and a composite barrier layer, in which the dispensed zinc oxide substrate being a zinc oxide material having a standard lattice structure of a wurtzite lattice structure comprises at least one acting surface, a back surface opposed to the acting surface, and at least one dispensing surface disposed between the acting surface and the back surface, and the composite barrier layer having a thickness greater than 1 nanometer and being correspondingly formed on the acting surface of the zinc oxide substrate comprises a first film layer, a second film layer, a plurality of accumulating film layers, an active layer and at least one high band-gap device body, in which the first film layer having a thickness greater than 0.1 nanometer and directly formed on the acting surface of the zinc oxide substrate, comprises a first material different from zinc oxide and is provided with a lattice constant ranged between 120% and 115% or between 105% and 95% of the standard lattice structure as being in the form of the wurtzite lattice structure; the second film layer having a thickness greater than 0.1 nanometer and directly formed on a surface of the first film layer, comprises a second material different from the zinc oxide and the first material and is provided with a lattice constant ranged between 120% and 115% or between 105% and 95% of the standard lattice structure as being in the form of the wurtzite lattice structure; the accumulating film layers are sequentially formed on the second film layer and each of which is different from the adjacent accumulating film layer and/or the second film layer and is provided with a lattice constant ranged between 125% and 110% or between 105% and 95% of the standard lattice structure as being in the form of the wurtzite lattice structure; the active layer formed on the composite barrier layer and corresponding to at least one acting surface comprises one acting material different from the zinc oxide and is provided with a lattice constant ranged between 105% and 95% of the standard lattice structure as being in the form of the wurtzite lattice structure; and the high band-gap device body is corresponding to the acting surface and formed on the active layer.

At least the first material of the first film layer, the second material of the second film layer, and at least part of material of the accumulating film layers is selected of groups composed of oxide, nitride and/or carbide of aluminum, boron, titanium, hafnium, niobium, thallium and rhenium, and the acting material of the active layer comprises aluminum-nitride based and/or gallium nitride based materials.

After the above programs are adopted, the composite barrier layer of the invention is cooperated with the chemically relatively stabilized material to barrier the molecule of the zinc oxide substrate, so that the zinc oxide molecule is not allowed to easily diffuse or dope into other layers. Besides, the composite barrier layer and the preferred chemical active zinc oxide substrate can facilitate the subsequent heat treatment and other manufacturing processes. With an economic zinc oxide substrate cooperated with a composite barrier layer manufacturing method, the advantage of an economic zinc oxide substrate can be obtained. With a low defect density of the zinc oxide substrate, the defect density of each film disposed on the zinc oxide substrate can be reduced, and thus the defect density of the finalized high band-gap device can be relatively reduced. Finally, with the disclosed techniques of the invention to quantitively control the thickness of each film layer, the degree of upward diffusion of zinc oxide can be precisely controlled by the composite barrier layer, and a flexible application can be provided.

A detailed description is given in the following embodiments with reference to the accompanying drawings.

BRIEF DESCRIPTION OF THE DRAWINGS

The aforementioned and other technical contents of the invention can be more clearly understood by reading the subsequent detailed description and embodiments with references made to the accompanying drawings, and the same elements in each of embodiments will be designated as same symbols, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
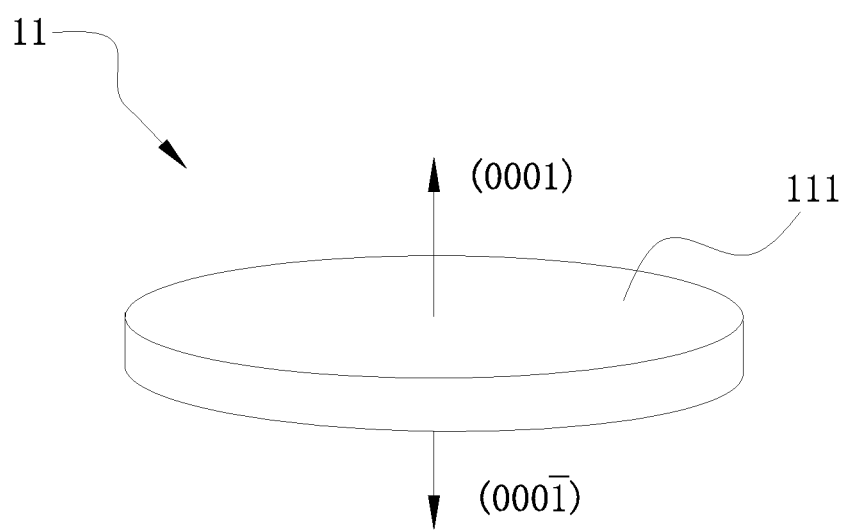
FIG. 1 is a partially schematic view of a first preferred embodiment of the invention, illustrating a zinc oxide substrate of this embodiment.
Figure 2:
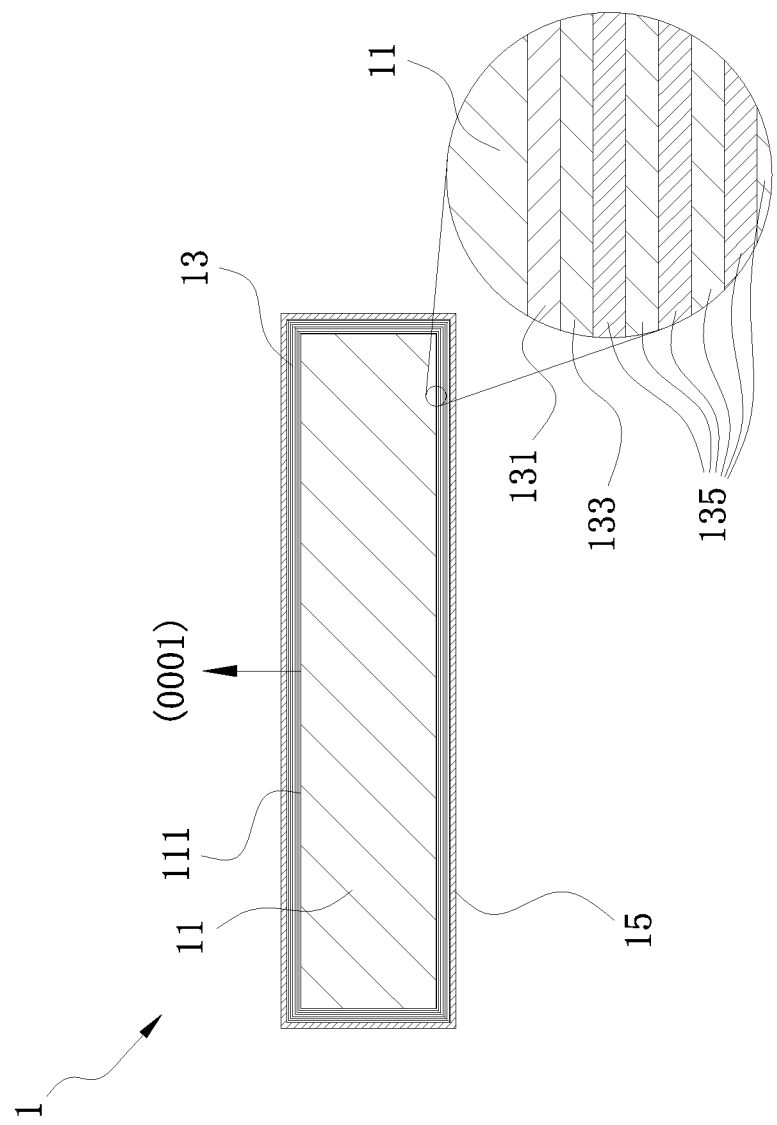
FIG. 2 is a sectional and partially enlarged schematic view of the embodiment in FIG. 1, illustrating an encapsulated substrate structure of this embodiment.
Figure 3:
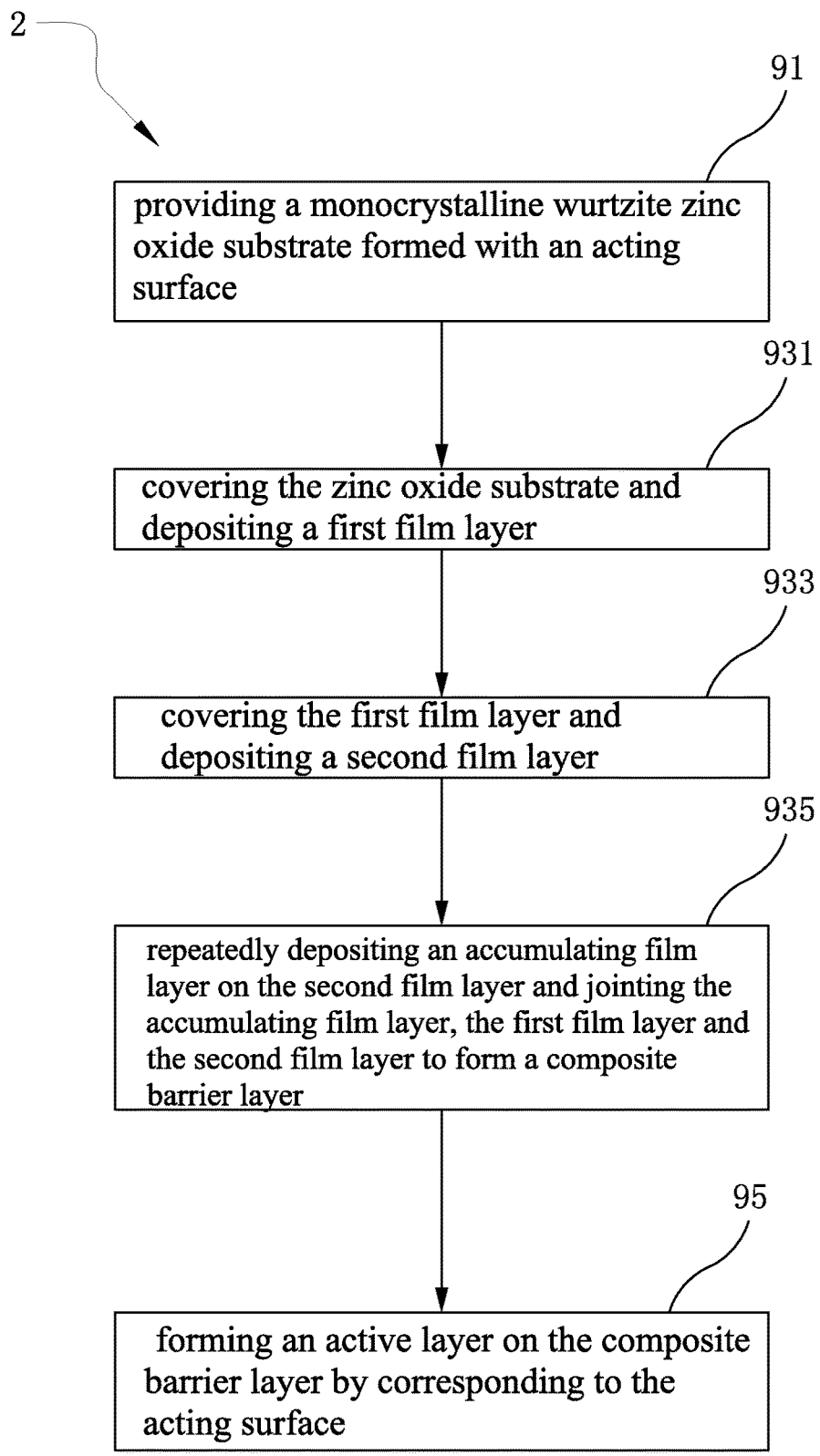
FIG. 3 is a procedure flowchart of the embodiment in FIG. 1, illustrating a method of manufacturing an encapsulated substrate of this embodiment.

Referring to FIGS. 1 to 3, a first preferred embodiment of the invention is disclosed, which provides a method 2 for preparing an encapsulated substrate 1 utilized to grow a high band-gap electronic device and for manufacturing the encapsulated substrate. Firstly, in a step 91, a zinc oxide substrate 11 with wafer level, for example, is provided. In this embodiment, a zinc oxide crystal having a wurtzite orientation is applied, which is defined as a standard lattice structure including lattice constants of "a", "b=a", and "c", and is formed as a zinc oxide monocrystal ingot manufactured by a generally wafer fabrication process. Then, a thin zinc oxide substrate 11 is fabricated by slicing the zinc oxide monocrystal ingot along the (0001) surface. As shown in FIG. 1, the zinc oxide substrate includes two flat surfaces, the (0001) surface and (000$\bar{1}$) surface, in which the (0001) surface is an acting surface prepared for a continue up-processing of crystal properties of zinc oxide substrate.

As shown in FIG. 2, an outer surface of the zinc oxide substrate 11, which includes the (0001) surface, the (000$\bar{1}$) surface and an outer edge, is coveringly deposited of a composite barrier layer 13, which for example substantially having a thickness of 10 nanometers. The composite barrier layer 13 formed of a multilayered film structure comprises a first film layer 131, a second film layer 133 and eight accumulating film layers 135. The first film layer 131 has a thickness substantially of 1 nanometer and is directly covered on the zinc oxide substrate 11. The second film layer 133 has a thickness substantially of 1 nanometer and is formed on a surface of the first film layer 131. The eight accumulating film layers 135 are sequentially formed on the second film layer 133. Note that the first film layer 131 is formed by a molecular beam epitaxy (MBE), and the rest of nine above-mentioned film layers are made of atomic layer deposition (ALD). Of course, it is simply understood to those skilled in the art that the properties of the above-mentioned zinc oxide substrate do not be directly affected, if the zinc oxide substrate 11 is doped with other elements and a substrate on the basis of the zinc oxide is utilized to replace a zinc oxide monocrystalline having a purity greater than 99 percent.

In a step 931 of this embodiment, a deposited example is referred to the first film layer 131 of the gallium nitride (GaN). When the gallium nitride material is in the form of wurtzite crystalline state, a misfit of the lattice constants of the gallium nitride material is less than 5% compared to the standard lattice structure of the invention, so that the gallium nitride material is suitable of bonding to and growing with the zinc oxide substrate. Next, in a step 933, the first film layer 131 is formed of the second film layer 133 by atomic layer deposition. In this embodiment, for example, differences relative to lattice constants a-direction and c-direction of the wurtzite lattice constant of aluminum nitride compared to the standard lattice structure are respectively ranged within from 2% to −0.05%. According to a formula, misfit= (lattice constant of aluminum nitride−lattice constant of zinc oxide)/(lattice constant of zinc oxide), misfits substantially ranged from 5% to −5% can be calculated respectively. On the other hand, if the formula is calculated by ratios of the lattice constants of aluminum nitride and zinc oxide to the lattice constant of a standard crystalline structure, the misfit is substantially ranged from 105% to 95%.

Next, in a step 935, the eight accumulating film layers 135 are deposited on the second film layer 133 in accordance with the regular repetitive arrangement of aluminum nitride/ boron nitride, so that the eight accumulating film layers 135 are formed as a mutually-crossed structure, in which a ratio of the lattice constant of boron nitride formed as a wurtzite structure to the lattice constant of the standard crystalline structure is substantially ranged from 119% to 120%. The study found that this lattice constant ratio is five fourths (5/4) of a simple integral ratio, in which a simple least common multiple is provided so that boron nitride can stably bond to and grow on the zinc oxide surface. Besides, the individual film layer of the composite barrier layer 13 comprises the first film layer 131, the second film layer 133 and the eight accumulating film layers 135, and each of which is in the form of an amorphous structure.

In this embodiment, the composite barrier layer 13 is formed by ten layers of materials in common, thus to increase interface number and density in a direction of facing a zinc oxide diffusion gradient and to increase an outwardly diffusive obstruction of zinc oxide by more material interfaces. Meanwhile, with the amorphous structure of this embodiment having less replaceable vacancies, a lengthy, complicated diffusive channel is correspondingly created, a possible channel of zinc oxide diffusion is relatively reduced, and an easily outward movement or reaction of zinc oxide is therefore hindered. In addition, the zinc oxide substrate formed by the composite barrier layer of the invention is completely isolated from the outward environment, so that other substances in the outward environment can be prevented from being reacted with the high chemical active zinc oxide substrate.

With the multilayered structure of the composite barrier layer 13 and a matched material selected as a buffering, the doping of zinc oxide can be absolutely prevented, and stresses accumulated among the material interfaces can be effectively dispersed. Therefore, with the encapsulated substrate 1 of the invention, defects such as peeling-off or cracking occurred in the aforementioned research report can be relatively diminished. Accordingly, with the disclosed method of manufacturing the encapsulated substrate of the invention, the composite barrier layer 13 can be uniformly and stably bonded to and growing with the zinc oxide substrate 11, and the connection relationship between the composite barrier layer 13 and the zinc oxide substrate 11 still can be perfectly sustained even in other subsequent manufacturing processes, thus to effectively increase yield rate of products.

Of course, it is to be understood that those skilled in the art can slightly adjust values of material arrangement and thickness of the above-mentioned film layers without deviation from the essence of this invention. In the preferred embodiments of the invention, although the gallium nitride is served as the first film layer and the boron nitride (BN) is served as the diffusive composite barrier layer, it is to be understood that those skilled in the art can easily replace the gallium nitride and the boron nitride (BN) by oxide, nitride or carbide (e.g., titanium carbide) of refractory metals such as aluminum, boron, titanium, hafnium, niobium, thallium and rhenium, and also these materials can be served as a material-selecting standard in consideration of the degree of matching.

In simple terms, the composite barrier layer 13 of the invention can be utilized to prevent the diffusion of the zinc oxide and to buffer stresses in materials. Moreover, in comparison with a film structure (e.g., a column crystalline structure growing in z-direction) which has crystal growth in one direction, the composite barrier layer 13 of the invention in the form of the amorphous structure can be homogenously compact and then cooperated with inherent advantages (e.g., using the zinc oxide as an acting surface of a substrate and to have a better lattice constant matching with an active layer material such as gallium nitride than that with sapphire using as a monocrystal substrate) of an acting surface of an original substrate. Furthermore, in some researches, diffusion is possible to have a positive effect, thus to precisely control the thickness of the composite barrier layer 13 and concentration and quantity of diffusion.

Finally, in a step 95, an active layer 15 is formed on the composite barrier layer 13 by chemical vapor deposition (VPD), in which aluminium gallium nitride (AlGaN) material of Al-rich is applied, and aluminium gallium nitride material doped with aluminum can be mixed with part of aluminum to excite photon ranged between a visible light and an ultraviolet light by adjusting mixture ratio. Besides, boron nitride can be possibly incorporated to serve as p-type semiconductor of pn junction. Those skilled in the art can easily know that, except the atomic beam epitaxy, the atomic layer deposition and the chemical vapor deposition, the continuous deposition method can further include physical vapor deposition (PVD), and these methods can be simply replaced according to requirements. The atomic beam epitaxy and the atomic layer deposition can reduce the thickness of a deposited film layer up to at least about 0.1 nanometer, so that the thickness of a ten-layered structure can be cumulatively deposited within 1 nanometer. However, to assure the integrity of depositions and coverings, each film layer also can be selectively deposited up to about 1 nanometer.

Figure 4:
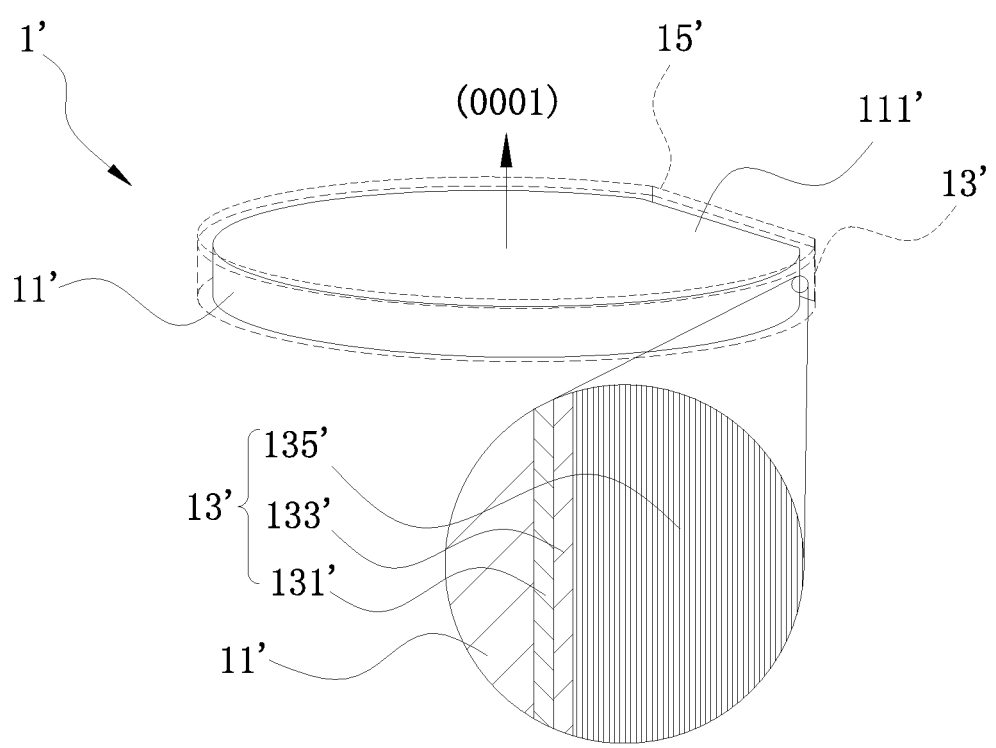
FIG. 4 is a partially perspective and partially enlarged schematic view of a second preferred embodiment, illustrating a method of manufacturing an encapsulated substrate of this embodiment.
Figure 5:
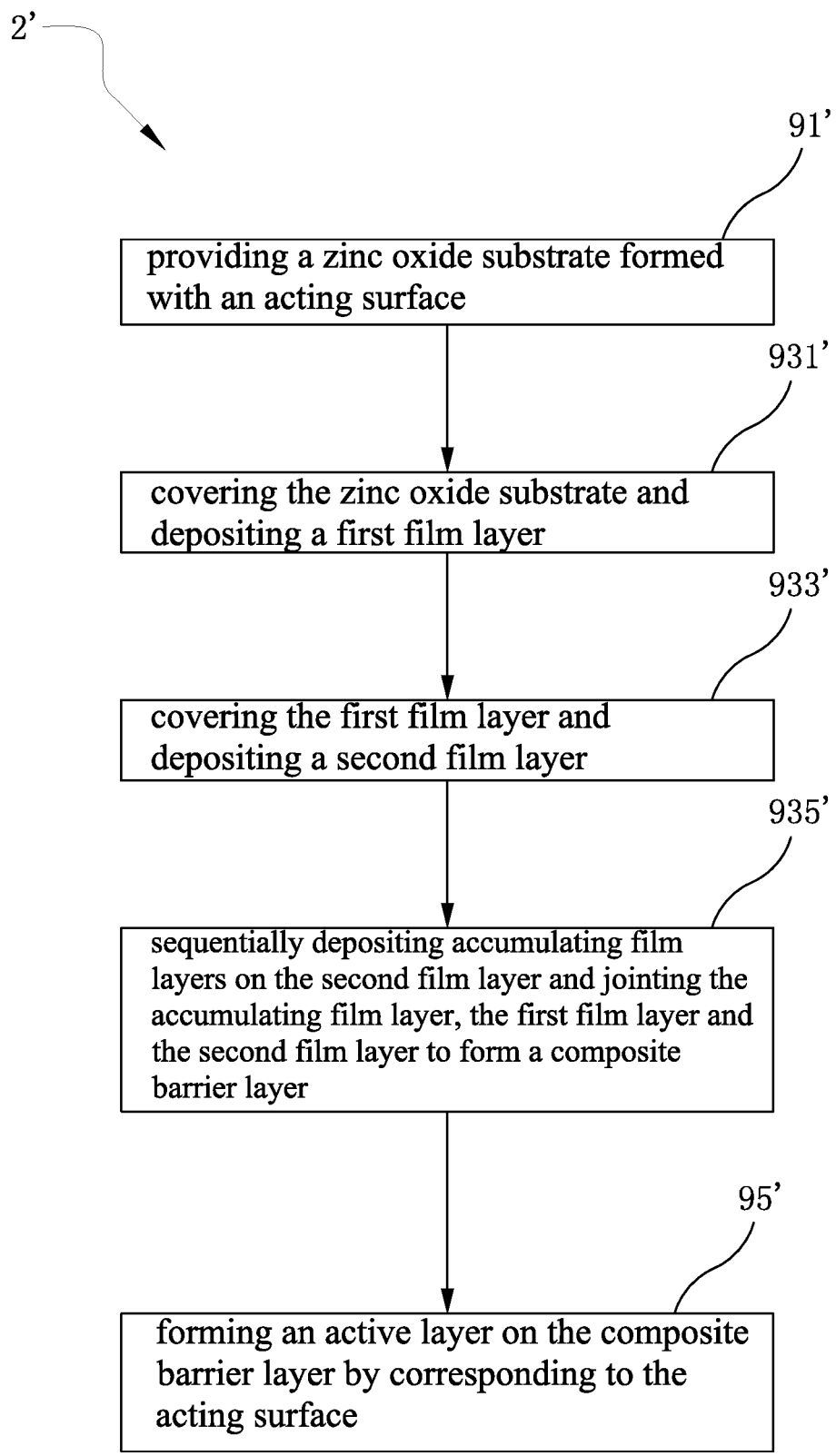
FIG. 5 is a procedure flowchart of the embodiment in FIG. 4, illustrating a method of manufacturing an encapsulated substrate of this embodiment.

Referring to FIGS. 4 and 5 simultaneously, in a second preferred embodiment of the invention, an encapsulated substrate 1' prepared for growing a light-emitting diode electronic member and a method 2' of manufacturing an encapsulated substrate are disclosed. To concisely describe this embodiment, the same as the first preferred embodiment will be omitted, and differences therebetween will be specifically described in detail. In a step 91', a zinc oxide substrate 11' is prepared in advance. In this embodiment, the zinc oxide substrate 11' can be a 13-inch wurtzite zinc oxide wafer product which is purchased and self-prepared. The zinc oxide substrate 11' is provided with a flat surface served as an acting surface 111', i.e., a (0001) surface. However, a person skilled in the art can easily use a non-polarized (11$\overline{2}$0) to replace the commonly-used polarized (0001) acting surface, for example, based on the submission of Shuji NAKAMURA without deviation from the essence of this invention, thus to increase the efficiency of light-emitting diodes.

Then, a composite barrier layer 13' is fully deposited and covered on the zinc oxide substrate 11'. As shown in FIG. 4, in this embodiment, the composite barrier layer 13' has a deposited thickness of 5,000 nanometers. However, for the purpose of saving time and costs, the composite barrier layer 13' can have a deposited thickness of 1,000 nanometers without deviation from the essence of this invention. The composite barrier layer 13' comprises one first film layer 131', one second film layer 133' and 246 accumulating film layers 135'. The first film layer 131' and the second film layer 133' are atomic layers having a thickness of 40 nanometers to grow deposits on the zinc oxide substrate 11' by the steps 931' and 933', respectively. The accumulating film layers 135' have 248 layers, each of which has a thickness of 20 nanometers to sequentially grow by molecular beam epitaxy. However, a person skilled in the art can easily adjust the thickness of the film layers according to requirements, thus to provide the film layers with different thicknesses, without deviation from the essence of this invention.

The first film layer 131' is made of the gallium nitride material correspondingly growing on the acting surface 0001 of the zinc oxide substrate 11', in which a difference between the corresponding lattice constant of the gallium nitride and the corresponding lattice constant of the standard lattice structure can be small up to 1.8%. Then, in the manufacturing process of the second film layer 133' made of indium gallium nitride (InGaN) and the first film layer 131', stresses produced therefrom are commonly distributed to cause the mutual bonding of film layers in the composite barrier layer 13' and to cumulate between the first film layer 131' and the zinc oxide substrate 11'.

Then, in a step 935', the 246 accumulating film layers 135' are deposited on the second film layer 133' by molecular beam epitaxy. The 246 accumulating film layers 135' at least comprises aluminium oxide, boron nitride and titanium oxide, which are sequentially accumulated on the surface of the second film layer 133' in an irregular arrangement. The accumulating film layers 135' are respectively made of different materials, and the accumulating film layers 135' and the second film layer 133' are respectively made of different materials, thus to create interfaces formed between the multilayered materials, capable of preventing the zinc oxide from outward diffusion and ramping up the degree of bearing stresses in the materials.

Meanwhile, a difference between the lattice constant of the aluminium oxide and the lattice constant of the standard lattice structure can be greater than 115% and less than 120%. Besides, a difference between the lattice constant of the boron nitride in the accumulating film layers 135' and the lattice constant of the standard lattice structure can be substantially ranged between 119% and 120%, in which a matching effect of a simple ratio least common multiple is formed when the difference is close to 120%. Therefore, the invention exists a lattice constant in a matching region ranged between 115% and 120%. Naturally, as to the lattice constant of the invention, a corresponding direction in the wurtzite structure can be utilized to correspond to a corresponding direction in a standard lattice structure (e.g., using the lattice constant "a" of the first film layer to correspond the lattice constant "a" of the standard lattice structure), and alternatively a similar proportional surface can be selected to correspond to the standard lattice structure. For example, in this embodiment, the process can be selectively executed on a surface (not limited to wurtzite 0001) surface) in a different direction but the lattice constant and the ratio are similar to those of the (0001) surface of the zinc oxide, and this surface in the different direction can be possibly matched to serve as the first film layer.

In addition, except the boron nitride capable of being served as the accumulating film layers, a person skilled in the art can easily use the boron nitride as the material of the first film layer 131' or the second film layer 133', as long as the first film layer 131', the second film layer 133', and the accumulating film layers 135' adjacent to the second film layer 133' are made of different materials, respectively. The boron nitride even can have potential for being a p-type contact layer of diode.

Finally, in the embodiment, the material of an active layer 15' is the aluminum nitride which is a diode material capable of producing ultraviolet light. In a step 95', the active layer 15' is deposited on the composite barrier layer 13' and corresponding to an acting surface 111' of a zinc oxide substrate 11', needless to cover the composite barrier layer 13' as shown in FIG. 5. Due to the active layer material made of gallium nitride based materials and/or aluminum-nitride based, a difference between the lattice constant of the active layer material and the lattice constant of the standard lattice structure, i.e., a ratio of the lattice constant of the active layer material to the lattice constant of the standard crystalline structure is substantially ranged from 105% to 95%, as the same as the first film layer 131'. Besides, after the encapsulated substrate 1' is processed by the method 2' of manufacturing the encapsulated substrate, stresses stored in the encapsulated substrate 1' can be released by annealing, and also the entire structure of the encapsulated substrate 1' can be particularly stabilized. Moreover, due to the multilayered structure of the composite barrier layer 13' of the invention, peeling-off or cracking of the encapsulated substrate 1' can be relatively diminished in the annealing process while undergoing a phase transition occurred therewith.

Figure 6:
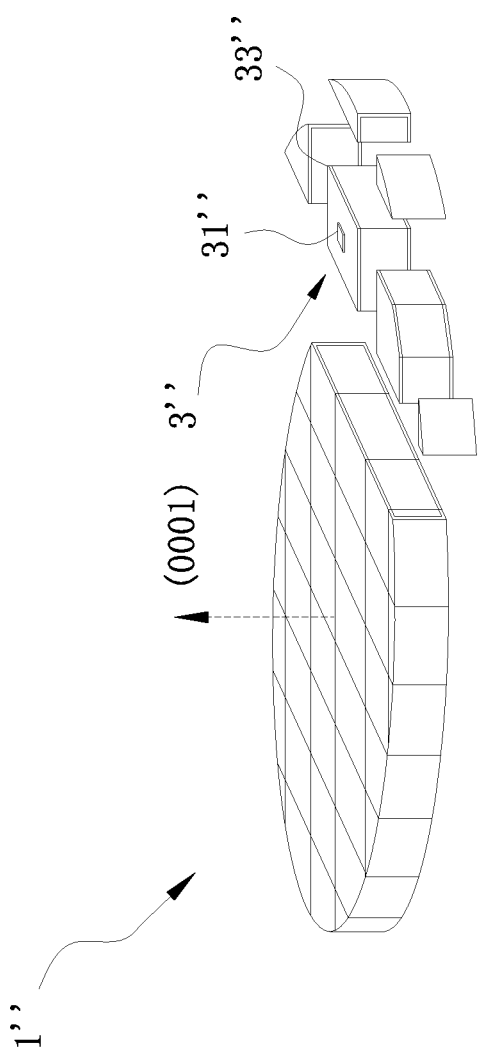
FIG. 6 is a perspective schematic view of a third preferred embodiment, illustrating a bonding state of an encapsulated substrate and a high band-gap device.
Figure 7:
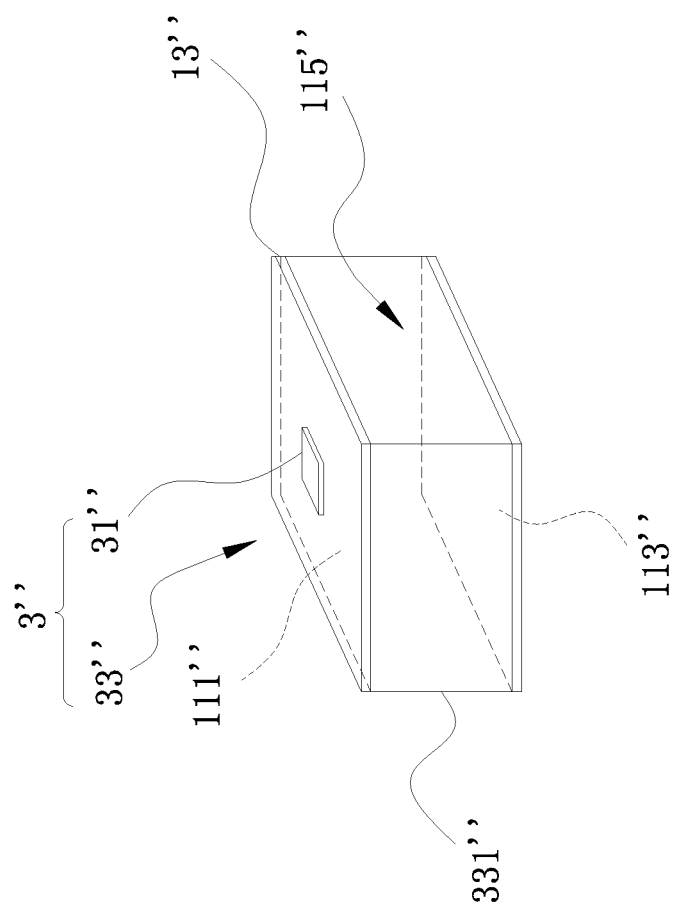
FIG. 7 is a perspective schematic view of the embodiment in FIG. 6, illustrating a structure of the high band-gap device provided with the encapsulated substrate.

Referring to FIGS. 6 and 7, in the third preferred embodiment of the invention, a high band-gap device 3" provided with a dispensed encapsulated substrate is disclosed. A high band-gap device body 31" is a light-emitting diode, which is dispensed by slicing. To concisely describe this embodiment, the same as the first preferred embodiment will be omitted, and differences therebetween will be specifically described in detail.

After the manufacturing process of semiconductor devices such as light-emitting diodes are completed on a surface of an encapsulated substrate 1", the encapsulated substrate 1" is dispensed. As shown in FIG. 6, in this embodiment, the encapsulated substrate 1" is sliced into a dispensed encapsulated substrate 33". A single, complete high band-gap device after being dispensed is provided with a part of an original to-be-dispensed substrate, i.e., a high band-gap device 3" is provided with at least one high band-gap device body 31" and the dispensed encapsulated substrate 33" bonded to the high band-gap device body 31". In this embodiment, the high band-gap device body 31" is a light-emitting diode. The dispensed encapsulated substrate 33" is a monocrystalline having an acting surface 111" on a surface (0001) and taking a wurtzite zinc oxide as a substrate. After the slicing process, a dispensed zinc oxide substrate 331" is obtained, and a dispensed surface 115" is formed between the acting surface 111" and a rear surface 113" opposed to the acting surface 111".

Figure 8:
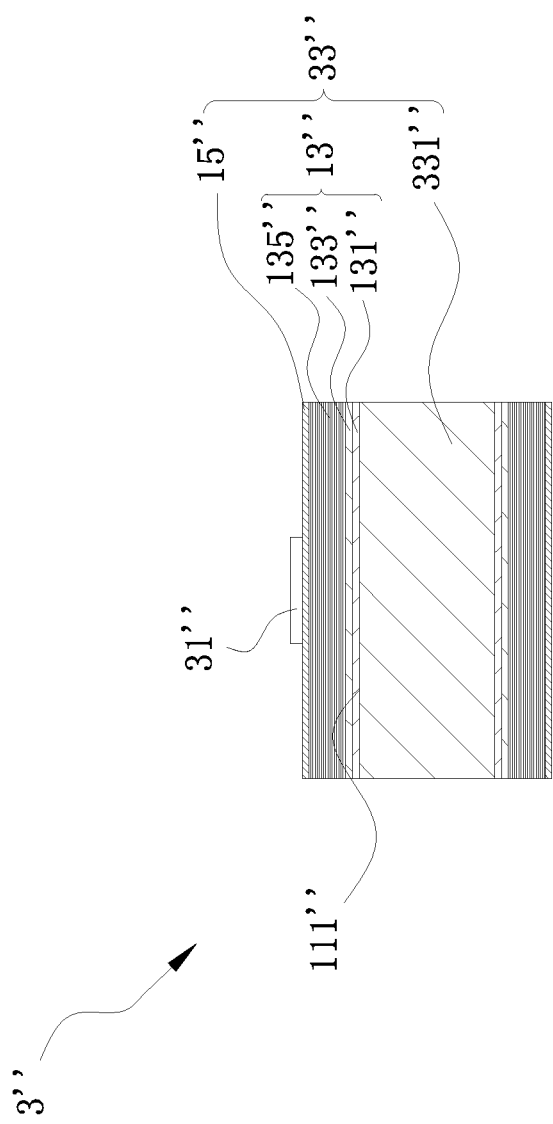
FIG. 8 is a sectional schematic view of the embodiment in FIG. 6, illustrating a structure of the high band-gap device provided with the encapsulated substrate.

Referring to FIG. 8 simultaneously, a composite barrier layer 13" is directly formed on the corresponding acting surface 111" of the dispensed zinc oxide substrate 331" after being dispensed. The composite barrier layer 13" comprises a first film layer 131" made of boron nitride and directly formed on the acting surface 111", a second film layer 133" selectively made of gallium nitride material, and 99 accumulating film layers 135". The first film layer 131" is directly formed on the acting surface 111" of the dispensed zinc oxide substrate 331", and the second film layer 133" and the accumulating film layers 135" are sequentially and upwardly accumulated on the corresponding acting surface 111" of the dispensed zinc oxide substrate 331". The 99 (not shown in FIGs.) accumulating film layers 135" comprises 50 accumulating film layers made of boron nitride and 49 accumulating film layers made of gallium nitride material. Besides, the first film layer 131", the second film layer 133" and the 99 accumulating film layers 135" respectively have a thickness of 50 nanometers. An active layer 15" made of gallium nitride based materials and having a thickness of 50 nanometers is formed as an uppermost layer of the accumulating film layers 135" corresponding to the acting surface 111" of the zinc oxide substrate. A person skilled in the art is known that the gallium nitride based materials comprises indium gallium nitride, aluminum gallium nitride, etc.

Besides, the high band-gap device body 31" such as the light-emitting diode is formed on the acting surface 111". A person skilled in the art is easily known that the high band-gap device body 31" can be other diodes or other kinds of electronic devices, and even microelectronic devices capable of being simply replaced. With the composite barrier layer 13" of the invention, the zinc oxide of the dispensed zinc oxide substrate 331" is prevented from upwardly diffusing to top layers such as the active layer 15" and even to the high band-gap device body 31" in a concentration gradient direction. Meanwhile, any possible stresses formed in the material internal manufacturing process can be dispersed by the composite barrier layer 13", so that the high band-gap device body 31" can be relatively and stably manufactured on the active layer 15". Based on the economic cost of zinc oxide material and the economic production cost, a high band-gap device with market competitiveness can be obtained.

Figure 9:
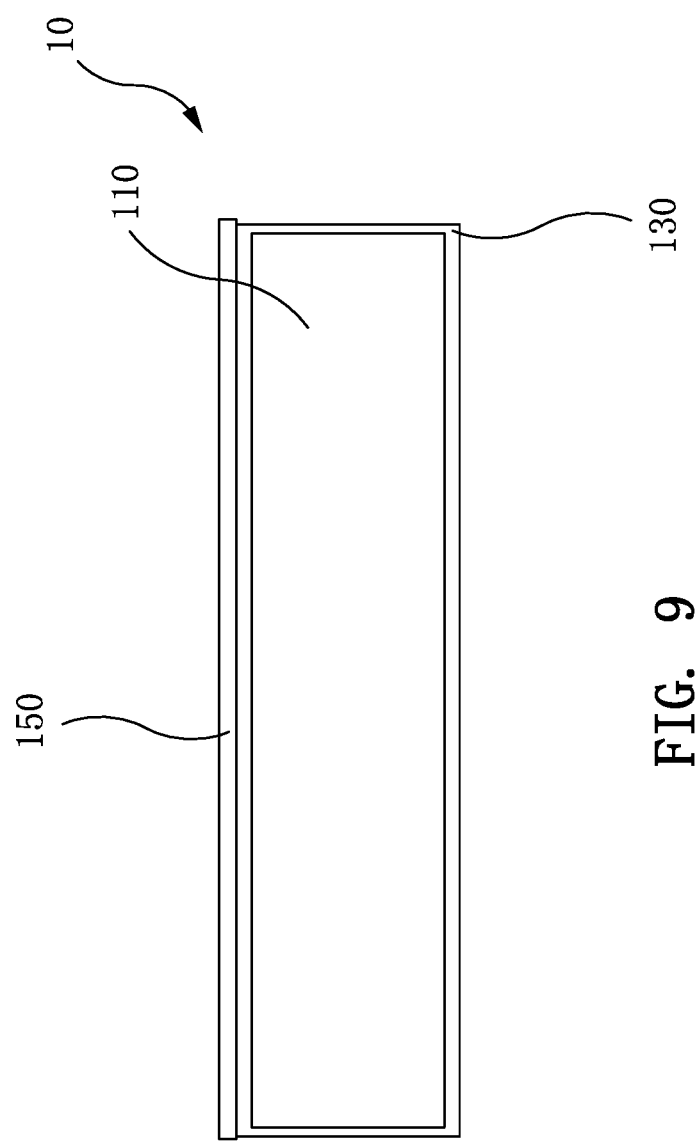
FIG. 9 is a partially perspective and partially enlarged schematic view of a fourth preferred embodiment, illustrating an encapsulated substrate structure of this embodiment.

Referring to FIG. 9, in the fourth preferred embodiment, an encapsulated substrate 10 is prepared for growing a high band-gap electronic device. A single barrier layer 130 having a thickness substantially ranged between 0.5 and 1,000 nanometers is coveringly deposited on an outer surface of a zinc oxide substrate 110. According to the method of forming the barrier layer film structure in the above embodiments, the single barrier layer 130 can be formed, and the description related therewith is omitted. An acting layer 150 is formed on the single barrier layer 130 by chemical vapor deposition. With the single barrier layer 130, the zinc oxide of the dispensed zinc oxide substrate 110 is prevented from upwardly diffusing to top layers such as the active layer 150 and even to the high band-gap device body (not shown in FIGs.). Meanwhile, any possible stresses formed in the material internal manufacturing process can be dispersed by the single barrier layer 130, so that the high band-gap device body can be relatively and stably manufactured on the active layer 150. Based on the economic cost of zinc oxide material and the economic production cost, a high band-gap device with market competitiveness can be obtained.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An encapsulated substrate, comprising:
   a zinc oxide substrate comprising at least one acting surface and being a zinc oxide material having a standard lattice structure of a wurtzite lattice structure; and
   a composite barrier layer having a thickness greater than 1 nanometer and being surroundingly covered on the zinc oxide substrate, comprising a first film layer which has a thickness greater than 0.1 nanometer and is directly covered and formed on the zinc oxide substrate comprises a first material different from zinc oxide and is provided with a lattice constant ranged between 120% and 115% or between 105% and 95% of the standard lattice structure as being in the form of the wurtzite lattice structure; a second film layer which has a thickness greater than 0.1 nanometer and is directly covered and formed on a surface of the first film layer comprises a second material different from the zinc oxide and the first material and is provided with a lattice constant ranged between 120% and 115% or between 105% and 95% of the standard lattice structure as being in the form of the wurtzite lattice structure; a plurality of accumulating film layers sequentially formed on the second film layer and each of which being different from the adjacent accumulating film layer and/or the second film layer and provided with a lattice constant ranged between 120% and 115% or between 105% and 95% of the standard lattice structure as being in the form of the wurtzite lattice structure; and an active layer formed on the composite barrier layer and corresponding to at least one acting surface, comprising an acting material different from the zinc oxide and provided with a lattice constant ranged between 105% and 95% of the standard lattice structure as being in the form of the wurtzite lattice structure.

2. The encapsulated substrate as claimed in claim 1, characterized in that an accumulating thickness of the composite barrier layer is ranged between 1 and 5,000 nanometers.

3. The encapsulated substrate as claimed in claim 2, characterized in that the accumulating thickness of the composite barrier layer is ranged between 10 and 1,000 nanometers.

4. The encapsulated substrate as claimed in claim 1, characterized in that the zinc oxide substrate comprises a monocrystalline, and the acting surface of the zinc oxide substrate is a (0001) surface of the wurtzite lattice structure.

5. The encapsulated substrate as claimed in claim 4, characterized in that an accumulating thickness of the composite barrier layer is ranged between 1 and 5,000 nanometers.

6. The encapsulated substrate as claimed in claim 5, characterized in that the accumulating thickness of the composite barrier layer is ranged between 10 and 1,000 nanometers.

7. The encapsulated substrate as claimed in claim 1, characterized in that at least the first material of the first film layer, the second material of the second film layer, and at least part of material of the accumulating film layers is selected of groups composed of oxide, nitride and/or carbide of aluminum, boron, titanium, hafnium, niobium, thallium and rhenium, and the acting material of the active layer comprises aluminum-nitride based and/or gallium nitride based materials.

8. The encapsulated substrate as claimed in claim 7, characterized in that an accumulating thickness of the composite barrier layer is ranged between 1 and 5,000 nanometers.

9. The encapsulated substrate as claimed in claim 8, characterized in that the accumulating thickness of the composite barrier layer is ranged between 10 and 1,000 nanometers.

10. The encapsulated substrate as claimed in claim 1, characterized in that the first film layer, the second film layer and the accumulating film layers comprises an amorphous structure.

11. The encapsulated substrate as claimed in claim 10, characterized in that an accumulating thickness of the composite barrier layer is ranged between 1 and 5,000 nanometers.

12. The encapsulated substrate as claimed in claim 11, characterized in that the accumulating thickness of the composite barrier layer is ranged between 10 and 1,000 nanometers.

13. A method of manufacturing an encapsulated substrate, characterized in that the method is provided for manufacturing the encapsulated substrate that comprises a monocrystalline having a standard lattice structure of a wurtzite lattice structure and a zinc oxide substrate having an acting surface and at least one composite barrier layer being surroundingly covered on the zinc oxide substrate, in which the composite barrier layer comprises a first film layer having a thickness greater than 0.1 nanometer and being directly covered and formed on the zinc oxide substrate, a second film layer having a thickness greater than 0.1 nanometer and being directly covered and formed on a surface of the first film layer, a plurality of accumulating film layers sequentially formed on the second film layer, and an active layer corresponding to at least one acting surface to be formed on the composite barrier layer, comprising the steps of:
   a) providing a piece of the zinc oxide substrate;
   b) at least depositing a layer of film in accordance with the following secondary steps sequentially:
      b1) directly depositing one first film layer comprising a first material on the zinc oxide substrate to cover thereon, in which the first material is different from zinc oxide and is provided with a lattice constant ranged between 120% and 115% or between 105% and 95% of the standard lattice structure as being in the form of the wurtzite lattice structure;
      b2) directly depositing one second film layer comprising a second material on the first film layer to cover thereon, in which the first material is different from the zinc oxide and the first material and is provided with a lattice constant ranged between 120% and 115% or between 105% and 95% of the standard lattice structure as being in the form of the wurtzite lattice structure; and
      b3) depositing at least one accumulating film layer on the second film layer and the material of each accumulating film layer being different from that of the adjacent accumulating film layer and/or the second film layer and the zinc oxide and provided with a lattice constant ranged between 120% and 115% or between 105% and 95% of the standard lattice structure as being in the form of the wurtzite lattice structure; and
   c) depositing the active layer on the composite barrier layer corresponding to at least one acting surface, in which the active layer comprises one acting material different from the zinc oxide and is provided with a lattice constant ranged between 105% and 95% of the standard lattice structure as being in the form of the wurtzite lattice structure.

14. The method of manufacturing the encapsulated substrate as claimed in claim 13, characterized in that the first material of the first film layer in the step b1), the second material of the second film layer in the step b2), and at least part of material of the accumulating film layers in the step b3) is selected of groups composed of oxide, nitride and/or carbide of aluminum, boron, titanium, hafnium, niobium, thallium and rhenium, and the acting material of the active layer in the step c) comprises aluminum-nitride based and/or gallium nitride based materials.

15. A high band-gap device provided with a dispensed encapsulated substrate, characterized in that the dispensed encapsulated substrate comprises a dispensed zinc oxide substrate and a composite barrier layer, in which the dispensed zinc oxide substrate being a zinc oxide material having a standard lattice structure of a wurtzite lattice structure comprises at least one acting surface, a back surface opposed to the acting surface, and at least one dispensing surface disposed between the acting surface and the back surface, and the composite barrier layer having a thickness greater than 1 nanometer and being correspondingly formed on the acting surface of the zinc oxide substrate comprises a first film layer, a second film layer, a plurality of accumulating film layers, an active layer and at least one high band-gap device body, in which the first film layer having a thickness greater than 0.1 nanometer and directly formed on the acting surface of the zinc oxide substrate, comprises a first material different from zinc oxide and is provided with a lattice constant ranged between 120% and 115% or between 105% and 95% of the standard lattice structure as being in the form of the wurtzite lattice structure; the second film layer having a thickness greater than 0.1 nanometer and directly formed on a surface of the first film layer, comprises a second material different from the zinc oxide and the first material and is provided with a lattice constant ranged between 120% and 115% or between 105% and 95% of the standard lattice structure as being in the form of the wurtzite lattice structure; the accumulating film layers are sequentially formed on the second film layer and each of which is different from the adjacent accumulating film layer and/or the second film layer and is provided with a lattice constant ranged between 125% and 110% or between 105% and 95% of the standard lattice structure as being in the form of the wurtzite lattice structure; the active layer formed on the composite barrier layer and corresponding to at least one acting surface comprises one acting material different from the zinc oxide and is provided with a lattice constant ranged between 105% and 95% of the standard lattice structure as being in the form of the wurtzite lattice structure; and the high band-gap device body is corresponding to the acting surface and formed on the active layer.

16. The high band-gap device provided with the dispensed encapsulated substrate as claimed in claim 15, characterized in that at least the first material of the first film layer, the second material of the second film layer, and at least part of material of the accumulating film layers is selected of groups composed of oxide, nitride and/or carbide of aluminum, boron, titanium, hafnium, niobium, thallium and rhenium, and the acting material of the active layer comprises aluminum-nitride based and/or gallium nitride based materials.

* * * * *